(12) United States Patent
Nunan (10) Patent No.: US 7,754,617 B2
(45) Date of Patent: Jul. 13, 2010

(54) POLYSILICON DEPOSITION AND ANNEAL PROCESS ENABLING THICK POLYSILICON FILMS FOR MEMS APPLICATIONS

(75) Inventor: Thomas Kieran Nunan, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 10 days.

(21) Appl. No.: 12/098,052

(22) Filed: Apr. 4, 2008

(65) Prior Publication Data

US 2009/0042372 A1   Feb. 12, 2009

Related U.S. Application Data

(60) Provisional application No. 60/910,274, filed on Apr. 5, 2007.

(51) Int. Cl.
H01L 21/302 (2006.01)
(52) U.S. Cl. ..................................... 438/725
(58) Field of Classification Search .................... None
See application file for complete search history.

(56) References Cited

U.S. PATENT DOCUMENTS

| | | | | |
|---|---|---|---|---|
| 2003/0222296 A1* | 12/2003 | Kumar et al. | ............... | 257/301 |
| 2006/0038103 A1* | 2/2006 | Helmbrecht | ........... | 248/346.01 |
| 2007/0111365 A1* | 5/2007 | Tateishi et al. | ............... | 438/53 |
| 2007/0119814 A1* | 5/2007 | Patel et al. | .................... | 216/59 |

FOREIGN PATENT DOCUMENTS

EP           1452481 A2    1/2004

OTHER PUBLICATIONS

G. Ready et al., "Developing a Manufacturable Process for the Deposition of Thick Polysilicon Films for Micro Machined Devices," IEEE/SEMI Advanced Semiconductor Manufacturing Conference, Sep. 12-14, 2000.

Influence of RTA Parameters on Residual Stress and Stress Gradient of Multilayered LPCVD Polysilicon Film; Eiji Yoshikawa et al., © 2002 IEEE, pp. 451-454.

(Continued)

*Primary Examiner*—Charles D Garber
*Assistant Examiner*—Andre' C Stevenson
(74) *Attorney, Agent, or Firm*—Sunstein Kann Murphy & Timbers LLP (57) ABSTRACT

A method of forming a thick polysilicon layer for a MEMS inertial sensor includes forming a first amorphous polysilicon film on a substrate in an elevated temperature environment for a period of time such that a portion of the amorphous polysilicon film undergoes crystallization and grain growth at least near the substrate. The method also includes forming an oxide layer on the first amorphous polysilicon film, annealing the first amorphous polysilicon film in an environment of about 1100° C. or greater to produce a crystalline film, and removing the oxide layer. Lastly, the method includes forming a second amorphous polysilicon film on a surface of the crystalline polysilicon film in an elevated temperature environment for a period of time such that a portion of the second amorphous polysilicon film undergoes crystallization and grain growth at least near the surface of the crystalline polysilicon film.

20 Claims, 5 Drawing Sheets

OTHER PUBLICATIONS

Influence of Annealing on Elastic Properties of LPCVD Silicon Nitride and LPCVD Polysilicon, Dieter Maier-Schneider et al.; Sensors and Materials, vol. 7, No. 2 (1995), pp. 121-129.

A New Technique for Producing Large-Area As-Deposited Zero-Stress LPCVD Polysilicon Films: The MultiPoly Process; Jie Yang et al., IEEE Journal of Microelectromechanical Systems, vol. 9, No. 4, Dec. 2000, pp. 485-494.

Elastic properties and microstructure of LPCVD polysilicon films; D. Maier-Schneidert et al., J. Micromech. Microeng, 6, (1996), pp. 436-446.

Rapid Thermal Annealing of Polysilicon Thin Films; Xin Zhang et al., Journal of Microelectromechanical Systems, vol. 7, No. 4, Dec. 1998, pp. 356-363.

International Search Report dated November 28, 2008.

* cited by examiner

POLYSILICON DEPOSITION AND ANNEAL PROCESS ENABLING THICK POLYSILICON FILMS FOR MEMS APPLICATIONS

CROSS-REFERENCE TO RELATED APPLICATIONS

This patent application claims priority to U.S. Provisional Patent Application No. 60/910,274 filed Apr. 5, 2007, entitled POLYSILICON DEPOSITION AND ANNEAL PROCESS ENABLING THICK POLYSILICON FILMS FOR MEMS APPLICATIONS, the disclosure of which is incorporated by reference herein in its entirety.

FIELD OF THE INVENTION

The invention generally relates to processing conditions enabling thick polysilicon films and, more particularly, the invention relates to processing conditions enabling thick polysilicon films for MEMS applications.

BACKGROUND OF THE INVENTION

Inertial sensors may be formed using micromachining processes and may include microelectromechanical systems (MEMS) devices. In MEMS devices, certain micromachined structures are designed to move relative to a substrate and other micromachined structures in response to forces applied. The operation of the MEMS device is dependent on the ability of the device to sense acceleration, motion and tilt. This may be achieved by suspending a proof mass with sense fingers or beams that are free to move between a set of fixed fingers. When the MEMS device undergoes acceleration, the proof mass moves resulting in a change in capacitance between the fixed and moving fingers. This change in capacitance is a measure of the acceleration applied. The sensitivity of the MEMS device is dependent on the capacitance change per applied g-force and the ability of the design to measure this change. Consequently, the sensitivity may be dependent on the area of the beam sidewalls (e.g., thickness, length and number of beams), spacing between the beams and the stiffness of restoring springs. Thus, one way to improve the MEMS device performance is to increase the thickness of the fingers or beams. The thicker films improve sensor signal to noise performance and also provide greater vertical stiction performance.

Standard MEMS device processing may involve thin film deposition, photolithography and etching techniques that are well known to those skilled in the art. During MEMS processing, multiple layers of material may be deposited on a substrate and then selectively etched away. A sacrificial layer is then removed leaving some structures suspended above or formed in the surface of the substrate. In MEMS inertial sensors, the sensor material used to make the sensor element is typically polysilicon and the sacrificial material that is etched away to release the polysilicon beams are typically deposited oxides. As a result of the manufacturing process, internal stresses in the various MEMS device components may cause their relative position to change after the release compared to their position before it. In order to have a properly functioning inertial sensor, the beams should remain substantially flat after the release. For the polysilicon beams to remain flat after release, the film layer should have a residual tensile stress and a low stress gradient through the thickness of the film. For example, a residual tensile stress prevents buckling of bridge structures that are anchored at both ends. Also, a low stress gradient prevents bending of the released beams. However, depositing a thick polysilicon layer for the beams may lead to an undesirable stress or stress gradient within the thick polysilicon layer, and/or may even result in film cracking.

SUMMARY OF THE INVENTION

In accordance with one embodiment of the invention, a method of forming a thick polysilicon layer for a MEMS inertial sensor includes forming a first amorphous polysilicon film on a substrate in an elevated temperature environment for a period of time such that a portion of the amorphous polysilicon film undergoes crystallization and grain growth at least near the substrate. The method also includes forming an oxide layer on the first amorphous polysilicon film, annealing the first amorphous polysilicon film in an environment of about 1100° C. or greater to produce a crystalline polysilicon film, and removing the oxide layer. Lastly, the method includes forming a second amorphous polysilicon film on a surface of the crystalline polysilicon film in an elevated temperature environment for a period of time such that a portion of the second amorphous polysilicon film undergoes crystallization and grain growth at least near the surface of the crystalline polysilicon film. When forming the oxide layer, the method may include targeting the oxide thickness to compensate for small stress gradients through the thickness of the film.

In accordance with related embodiments, the first amorphous polysilicon film and/or the second amorphous polysilicon film may include a dopant species having a concentration between about 5e19 atm/cm$^3$ to about 5e20 atm/cm$^3$. The dopant species may include phosphorus. The elevated temperature environment may be between about 550° C. to about 600° C. for the first amorphous polysilicon film and/or the second amorphous polysilicon film. The oxide layer may have a thickness of about 50 Å or greater, preferably between about 100 Å to about 200 Å. Removing the oxide layer may include using a hydrofluoric acid etch. The first amorphous polysilicon film may be annealed for about 2 hours or greater. The annealing may be in an environment between about 1130° C. to about 1170° C.

In accordance with another embodiment of the invention, a method of forming a sense element in a MEMS inertial sensor includes forming a first polysilicon layer on a substrate in an environment between about 550° C. to about 600° C., the first polysilicon layer having a dopant species concentration between about 5e19 atm/cm$^3$ to about 5e20 atm/cm$^3$. The method also includes forming an oxide layer on the first polysilicon layer, the oxide layer having a thickness of about 50 Å or greater, annealing the polysilicon layer in an environment of about 1100° C. or greater, and removing the oxide layer. Lastly, the method includes forming a second polysilicon layer on the first polysilicon layer in an environment between about 550° C. to about 600° C., the second polysilicon layer having a dopant species concentration between about 5e19 atm/cm$^3$ to about 5e20 atm/cm$^3$.

In accordance with related embodiments, the dopant species may include phosphorus. Removing the oxide layer may include using a hydrofluoric acid etch. The oxide layer may have a thickness of about 100 Å to about 200 Å. The polysilicon layer may be annealed for about 2 hours or greater. Forming the first polysilicon layer and/or forming the second polysilicon layer may be in an environment between about 570° C. to about 590° C. The annealing may be in an environment between about 1130° C. to about 1170° C. The annealing environment may include an inert gas, such as nitrogen. Forming the oxide layer may occur at the beginning of the annealing process. The first polysilicon layer and/or the second polysilicon layer may have a thickness of about 4 μm or greater.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

Various embodiments of the present invention include process conditions that enable a thick polysilicon layer to be deposited as the sensor material in an inertial sensor having the desired residual stress and stress gradient through the film. The process conditions allow standard low pressure chemical vapor deposition (LPCVD) polysilicon deposition tools to be used. Some embodiments include the appropriate combination of deposition temperature, pressure, partial pressure of the silane source gas and the concentration and distribution of a dopant species, such as phosphorous, in the film to control the residual stress and the stress gradient in the film as well as the grain structure and morphology of the film. Various embodiments further include anneal conditions between deposition layers to reduce the residual stress and prevent film cracking. Some embodiments further include process conditions, such as the clean conditions and loading configuration for the deposition tool, between each polysilicon deposition layer to prevent oxide formation between the deposited layers enabling a homogenous final film stack. Details of illustrative embodiments are discussed below.

Figure 1A:
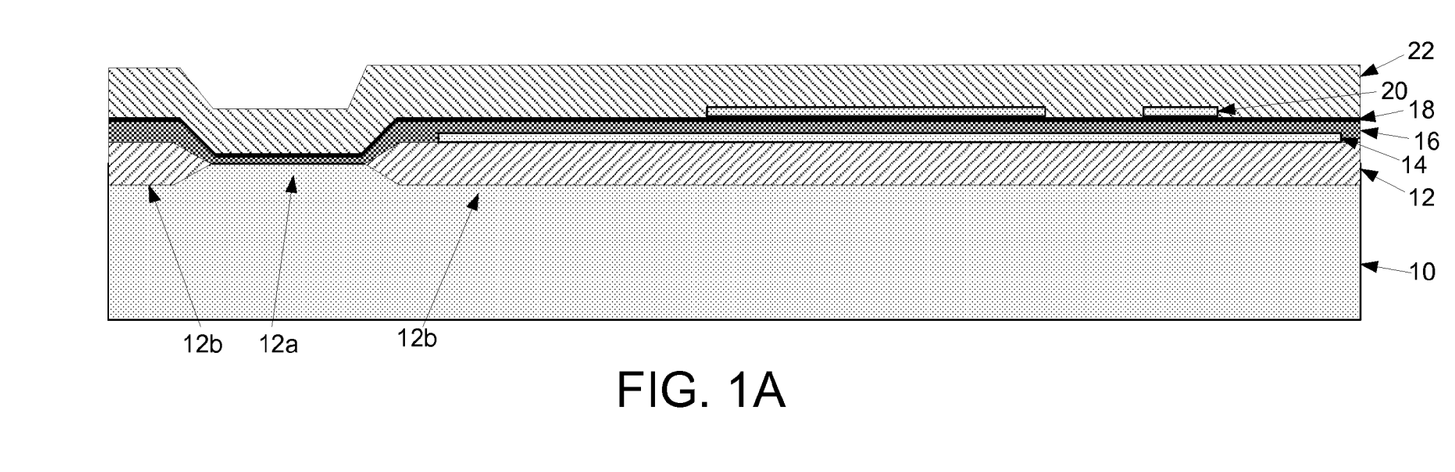
FIGS. 1A-1D schematically show cross sectional views of a MEMS device during stages in a process of forming the device with a thick polysilicon layer according to illustrative embodiments of the present invention.
Figure 1B:
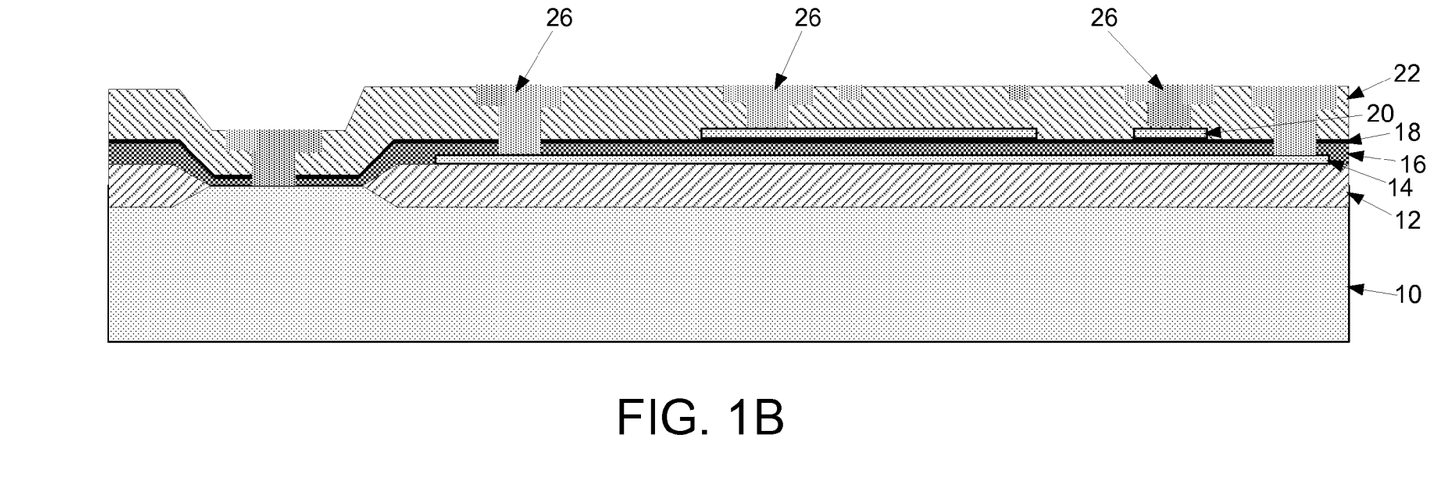
Figure 1C:
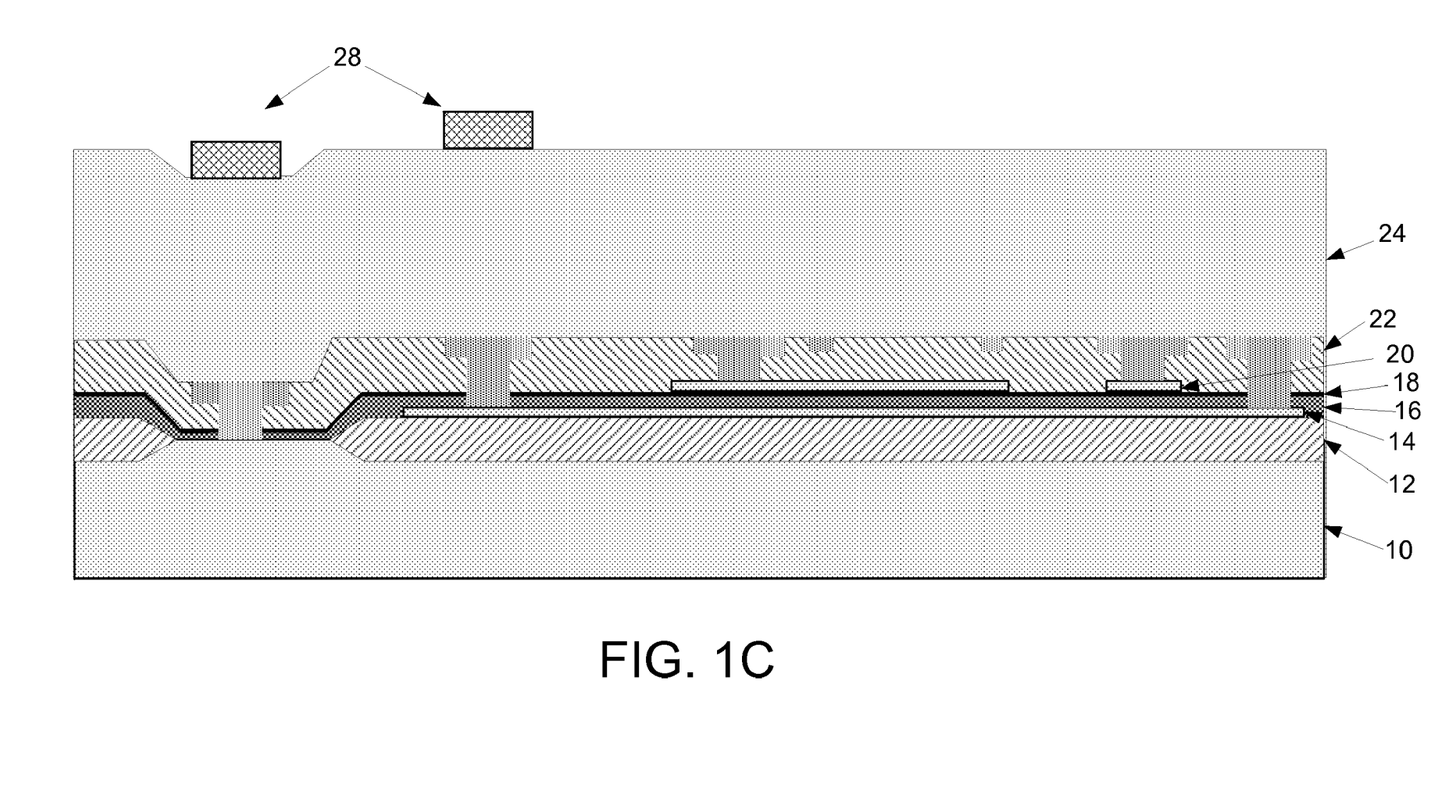
Figure 1D:
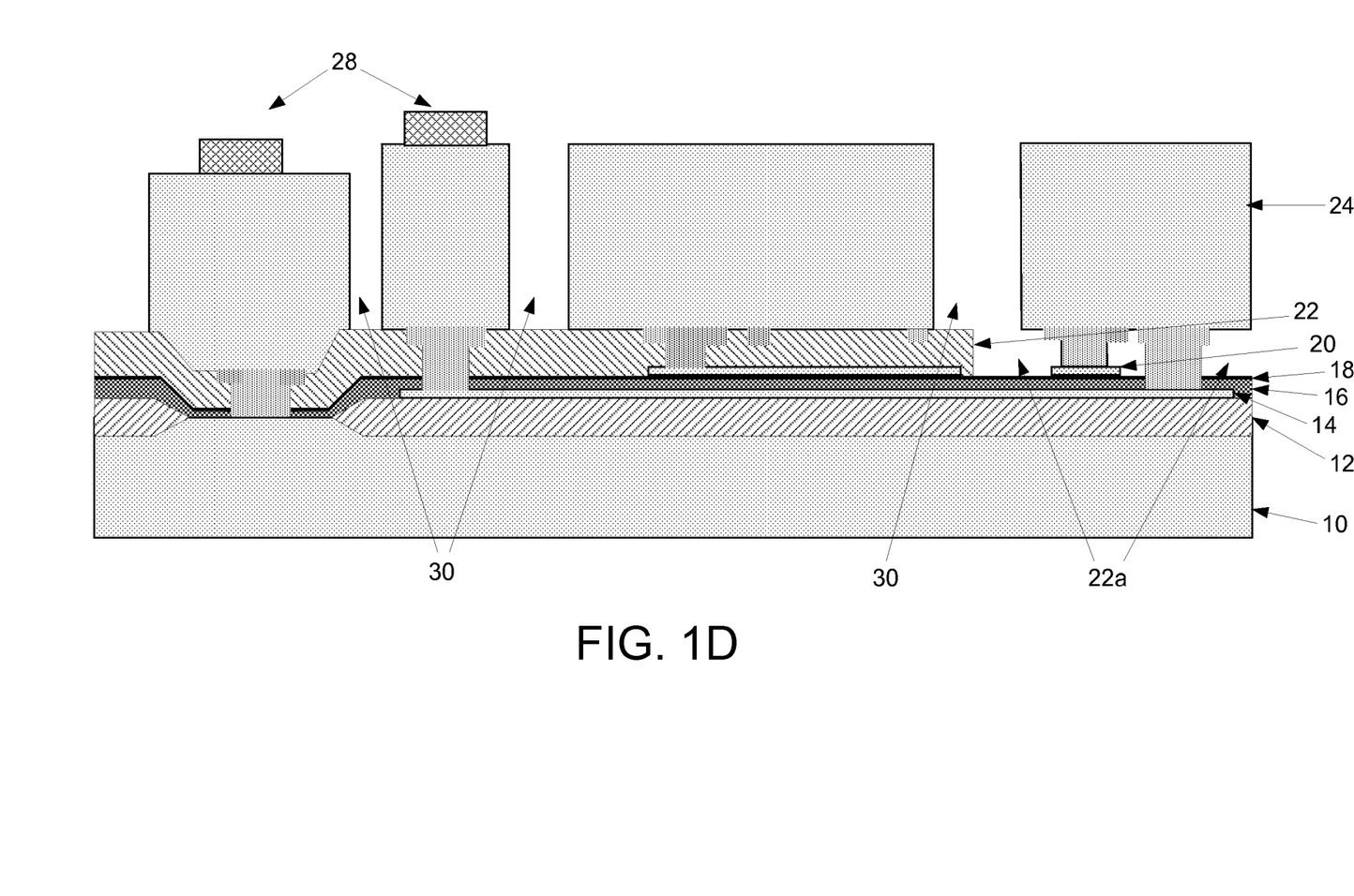
Figure 2:
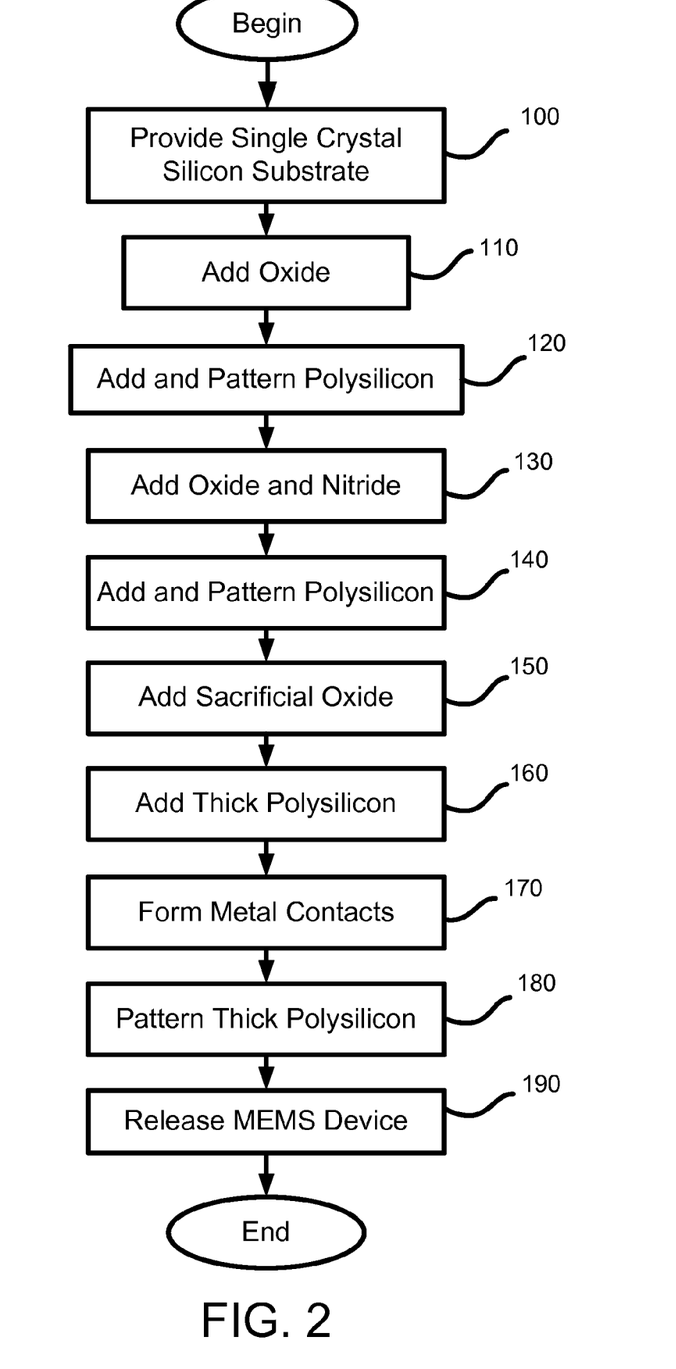
FIG. 2 shows a process of forming a MEMS device with a thick polysilicon layer according to illustrative embodiments of the present invention.

FIGS. 1A through 1D schematically show cross sectional views of a MEMS device during stages in a process of forming the device with a thick polysilicon layer and FIG. 2 shows a process of forming the MEMS device according to illustrative embodiments of the present invention. Although the following discussion describes various relevant steps for forming the MEMS device, it does not describe all the required steps. Other processing steps may also be performed before, during, and/or after the discussed steps. Such steps, if performed, have been omitted for simplicity. The order of the processing steps may also be varied and/or combined. Accordingly, some steps are not described and shown.

Referring to both FIGS. 1A and 2, the process begins at step 100, which provides a single crystal silicon substrate 10. The substrate 10 may be formed from a single crystal silicon wafer, as shown, or formed from a silicon-on-insulator ("SOI") wafer. In step 110, an oxide layer 12 may be added to or formed on the substrate 10. The oxide layer 12 may be deposited onto the substrate 10 or, preferably, may be grown on the substrate 10. In order to minimize the stress and bowing of the substrate 10, the oxide 12 may be formed on both the top and bottom surfaces of the substrate 10 (not shown). As used herein, the top surface of the substrate 10 refers to the surface of the substrate in which the MEMS device may be formed. As is well known to those skilled in the art, various areas of the substrate 10 may be masked off or patterned, so that a very thin oxide 12 is formed in some areas 12a compared to other areas 12b where the oxide 12 is much thicker. The oxide 12b serves to electrically isolate the substrate 10 from the subsequent layers formed on the substrate 10 and provide a low parasitic capacitance to the substrate 10.

In step 120, a polysilicon layer 14 may then be added to or formed on the oxide 12. As known to those skilled in the art, the polysilicon 14 may be formed on the oxide 12 using a variety of deposition processes such as Plasma Enhanced Chemical vapor deposition or, preferably, chemical vapor deposition, e.g., low pressure chemical vapor deposition (LPCVD). The polysilicon 14 may be formed with a dopant species, such as phosphorus (e.g., introduced in reaction gas $PH_3$), which may be added during the deposition step or by adding a $POCL_3$ or phosphorous ion implantation step after the deposition process or formed without a dopant species. Similar to the oxide 12 layer, the polysilicon 14 may be formed on both the top and bottom surfaces of the substrate 10 (not shown) in order to minimize the stress on the substrate 10. Returning to step 120, the polysilicon 14 may be patterned (e.g., selected areas of the polysilicon removed) using processes well known to those skilled in the art, e.g., using photolithography and etching techniques. For example, photo resist may be formed over the surface of the wafer or die. Then, using standard photolithography techniques, the photo resist may be patterned and removed in selected areas to expose the underlying polysilicon 14. The polysilicon 14 may then be removed using a dry, plasma etch process that may use chemicals. Other removal processes may also be used as well known to those skilled in the art. The photo resist may then be removed.

In step 130, another oxide layer 16 may be added to or formed on the polysilicon 14 and a nitride 18 may then be added to or formed on the oxide 16. In areas where the polysilicon 14 has been removed, the oxide 16 may be formed on the oxide 12. The oxide 16 may be grown or, preferably, may be deposited on the polysilicon 14 and oxide 12. The oxide 16 may be deposited on both side of the substrate 10 in order to minimize the stress and bow of the substrate. The oxide 16 may also be added without any dopant species. The nitride 18 provides a layer or an etch stop to facilitate the subsequent removal of a sacrificial oxide layer during the release of the MEMS device. In step 140, another polysilicon layer 20 may then be added to or formed on the nitride 18 similar to that discussed above for polysilicon 14. Also, similar to the oxide 12 and polysilicon 14, the polysilicon 20 may be formed on both the top and bottom surfaces of the substrate 10 (not shown) in order to minimize the stress and bow of the substrate 10. Returning to step 140, the polysilicon 20 may then be patterned as discussed above for polysilicon 14.

In step 150, a sacrificial oxide layer 22 may be added to or formed on the polysilicon 20. In areas where the polysilicon 20 has been removed, the sacrificial oxide 22 may be formed on the nitride 18. Similar to oxide 16, the sacrificial oxide 22 may be grown or, preferably, may be deposited on the polysilicon 20 and nitride 18. The oxide 22 may be deposited on both sides of the substrate 10 in order to minimize the stress and bow of the substrate. The sacrificial oxide 22 may also be added without any dopant species. Referring also to FIG. 1B, the sacrificial oxide 22, the nitride 18, the oxide 16 and the thin oxide 12a may then be patterned and contacts or anchors 26 may be formed in or on the various layers.

Referring also to FIG. 1C, a thick polysilicon layer 24 may then be added to or formed on the sacrificial oxide 22 and on the anchors 26 (step 160). The process of forming the thick polysilicon layer 24 is discussed in more detail below with regard to FIG. 3. In step 170, metal contacts 28 or circuitry may be formed in a conventional manner in selected areas on the thick polysilicon 24. The metal contacts 28 may provide an electrical contact and interface for the MEMS device. The metal contacts 28 or circuitry may be located at any convenient location and may be formed in and/or on the silicon substrate 10 or die. Alternatively, or in addition, the metal contacts 28 or circuitry may be used to connect the MEMS device to circuitry formed on another chip or die. Referring also to FIG. 1D, the thick polysilicon 24 may be patterned or trenches 30 formed in the layer (step 180). In step 190, the sacrificial oxide 22 is then removed in selected areas 22a to release or suspend a portion of the MEMS device above the surface of the substrate 10 (or in the surface of the substrate in the case of an SOI substrate), enabling some structures of the device to move relative to other structures and the substrate 10.

Other processing steps may be taken to complete production of the MEMS device. For example, if done in a batch process, the wafer may be diced to form a plurality of individual dies. When discussing various processes, the terms "wafer" and "die" may be used interchangeably, although a wafer may form a plurality of individual dies. As mentioned above, some embodiments may implement post-processing methods for integrating the MEMS device with circuitry on another die. In addition, cap structures may be added to cover and protect the MEMS device. As mentioned, the MEMS device shown and discussed in FIGS. 1A through 1D and FIG. 2 is exemplary. Thus, embodiments may vary from the process shown and discussed above.

Figure 3:
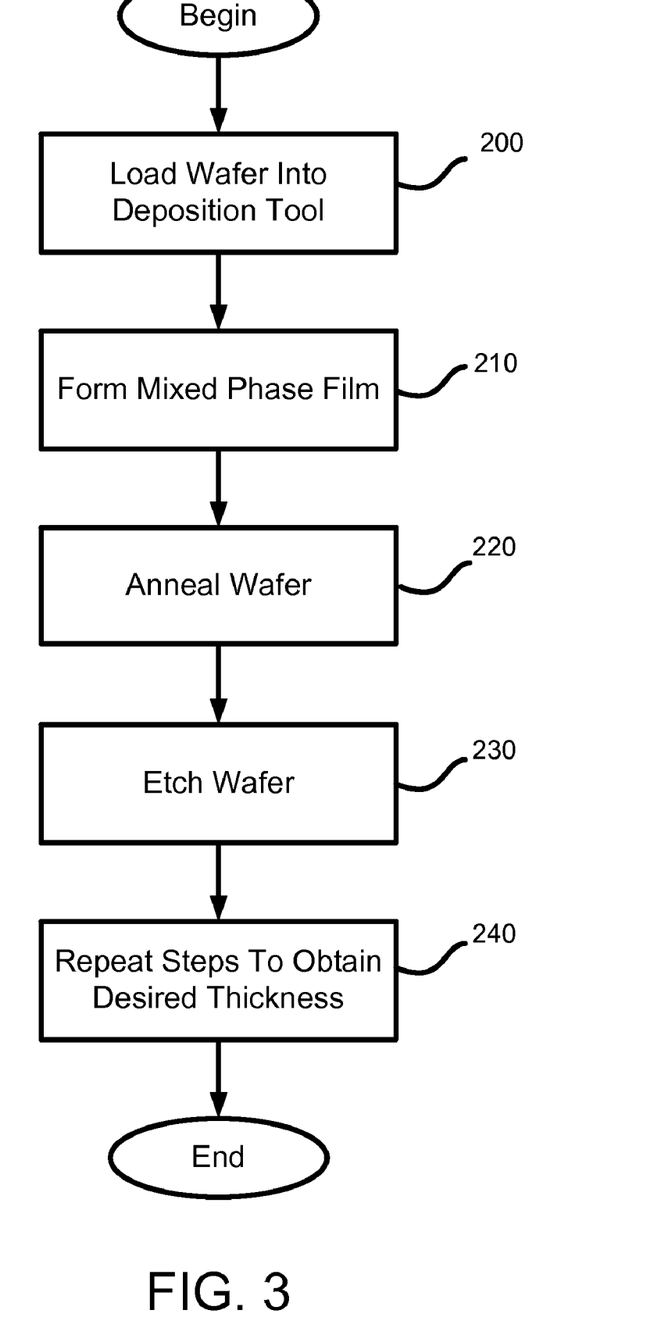
FIG. 3 shows a process of forming a thick polysilicon layer according to illustrative embodiments of the present invention.

FIG. 3 shows a process of forming a thick polysilicon layer according to illustrative embodiments of the present invention. The thick polysilicon layer 24 may be the sensor material in a MEMS inertial sensor. As mentioned above, in order to have a properly functioning inertial sensor, the beams or sensor element should remain substantially flat after its release. Thus, the thick polysilicon 24 should have a residual tensile stress and a low stress gradient through the thickness of the film. In order for the film to have a residual tensile stress, the film should be deposited with some amount of amorphous regions. Shrinkage of the film during crystallization and grain growth of this amorphous region may provide the residual tensile stress. Completely amorphous films have excessive tensile stress resulting in film cracking and completely crystalline films as deposited typically have a compressive stress. However, amorphous films that are annealed long enough at sufficiently high temperatures to provide crystallization and grain growth tend to have a tensile stress. Additional annealing of the amorphous film after crystallization usually results in a reduction in the residual stress to a low tensile level. Sufficient annealing time and temperature may also allow any portion of the polysilicon film that is still amorphous to become crystalline. Thus, the process conditions should be carefully controlled both during and after the deposition process to produce a film with the desired stress levels and thickness.

In step 200, one or more wafers may be loaded into a deposition tool, such as a standard LPCVD furnace. A wafer may include the substrate 10 and any layers formed on the substrate 10 (e.g., layers 12, 14, 16, 18, 20, and 22). Polysilicon may be deposited in the tool by the decomposition of silane ($SiH_4$) to Si and $2H_2$. In step 210, a mixed phase film may be formed on the surface of the wafer so that the film is mostly crystalline in the lower region of the film toward the substrate and amorphous near the surface. In order to accomplish this, the deposition temperature and the silane partial pressure (e.g., $SiH_4$ flow and reactor chamber (tube) pressure) should be set to deposit a mostly amorphous film as deposited. For example, a deposition temperature below about 600° C. typically deposits a mixed phase or partially amorphous silicon film, but a deposition temperature below about 550° C. typically deposits a fully amorphous film. The film crystallinity is also dependent on the silane flow and the tube pressure. For example, a silane flow in the region of about 400 sccm and a tube pressure in the region of 400 mtorr may be used. A higher silane flow and higher tube pressure provides a more amorphous film at a fixed temperature. However, there are limitations to increasing the silane flow and the tube pressure. At higher silane flows and tube pressure (e.g., greater than 400 sccm $SiH_4$ and 400 mtorr, resp.), enhanced deposition may occur at the very edge of the wafer. This may undesirably result in up to a 2× difference in film thickness within a 2 mm ring around the wafer edge.

In order to minimize the stress gradient in the film, the polysilicon film may also be formed with a dopant species, such as phosphorous, to produce a small, uniform grain structure. Phosphorous is a larger atom than silicon and tends to add a compressive stress or reduce the tensile stress in the film. As such, the curvature and residual stress in the film and susceptibility of thick films to crack may be dependent on the amount of phosphorous doping. Thus, the optimum process conditions should be chosen to provide a low residual tensile stress film with low stress gradient. For example, adding too little phosphorous tends to produce films with a negative curvature, higher residual stress and susceptibility of a thick film to crack, but adding too much phosphorous results in an undesirable compressive residual stress and an increase in the surface roughness of the film. Too much phosphorous also tends to increase the formation of individual large grains that may extend to the film surface. These large individual grains may appear like point defects and cannot be distinguished from particle contamination during defect inspection. In addition, the dopant concentration level in the film should be relatively uniform across the wafer and throughout the thickness of the film. To provide the required process control, the dopant may be added during the deposition process so that the dopant is uniformly incorporated into the film, as opposed to adding the dopant after film growth, e.g., using ion implantation. For example, a LPCVD vertical furnace may be used with multi-hole injectors introducing the phosphorous (e.g., in the form of $PH_3$) and a rotating wafer holder to compensate for phosphorous depletion over the surface of the wafer(s) in the reactor.

Adding phosphorous also tends to lower the deposition rate of the film. However, this may be compensated for by increasing the silane flow and tube pressure which provides higher deposition rates and a more amorphous film. With careful targeting of the temperature, silane flow, reactor pressure and phosphorus flow, thick polysilicon films may be deposited with relatively fast deposition rates, (e.g., 40-60 Å/min), low residual tensile stress, low stress gradient and smooth surfaces.

Accordingly, the deposition temperature or environment may be between about 550° C. and about 600° C., preferably between about 570° C. to about 590° C., and more preferably around about 580° C. This temperature range enables the film to be mostly amorphous as deposited but allows the deposited film to undergo crystallization and grain growth as the subsequent layers are formed and the time in the reactor is increased. As a result, the film may be mostly crystalline in the lower region of the film toward the surface of the substrate or previously formed polysilicon layer and amorphous near the surface which has had less time in the reactor than the lower region. The phosphorous concentration throughout the film may be between about 5e19 atm/cm$^3$ to about 5e20 atm/cm$^3$ and preferably around about 1e20 atm/cm$^3$. Depending on the deposition temperature range used, the silane flow, reactor pressure and phosphorus (e.g., PH$_3$) flow may be chosen to produce a film having a relatively small, uniform grain structure and a uniform thickness across the wafer. Preferably, the deposition process may produce films up to about 4 µm-5 µm in thickness before the wafer should proceed to the next step in the process (step 220).

In step 220, the wafer is annealed or subjected to a high temperature in an inert atmosphere, such as nitrogen (N$_2$), to produce a crystalline film. In order to lower the residual stress and reduce the stress gradient in the as deposited film and the susceptibility of the film to cracking when a second thick polysilicon film is deposited (e.g., to further increase the film thickness), an annealing temperature or environment of about 1100° C. or greater, preferably between about 1100° C. to about 1200° C., more preferably between about 1130° C. to about 1170° C., and most preferably around about 1150° C., although higher temperatures may be used. The wafer may be annealed for about two hours or greater. A thin oxide layer may be formed before or at the start of the annealing process to reduce the sensitivity of film to the anneal ambient. For example, the wafer may be loaded in a furnace and the environment brought to the annealing temperature. Oxygen may then be introduced into the furnace for a short period of time in order to grow the desired oxide thickness. For example, the oxide layer may have a thickness of about 50 Å or greater, preferably between about 100 Å to about 500 Å, and more preferably between about 100 Å to about 200 Å, although higher thicknesses may be used. An inert gas may then be introduced into the furnace for the remainder of the annealing process. Annealing in an inert atmosphere, such as N$_2$, without an oxide layer may result in an out diffusion of the dopant (e.g., phosphorous) or a depletion of the dopant near the surface and possibly a very thin (e.g., nitride) region forming at the surface. This may undesirably result in a narrow high tensile stress region at the surface and may result in the released beams bowing down in the middle. Forming a thin oxide film on the thick polysilicon layer before or at the beginning of the annealing process tends to reduce this affect. The thin oxide layer may also help in providing a smooth surface film since the oxide layer may help to control the lateral grain growth and reduce the vertical grain growth, minimizing the extent that grains protrude above the surface of the film. Thus, smooth, thick films may be achieved by targeting the deposition conditions to provide a narrow amorphous region at the surface and then growing a thin oxide layer before or at the start of the annealing process. In addition, the thickness of this oxide layer may be targeted to compensate for any intrinsic stress gradient in the bulk of the film. The formation of this oxide layer at the beginning of the anneal step may introduce a small compressive stress region in the top few hundred Angstoms of the film surface and this compressive region may compensate for a negative stress gradient in the bulk of the film.

In step 230, the annealed wafer may be etched to remove any oxide that was formed on the polysilicon before, during or after the annealing step. For example, the wafer may be submerged or rinsed with a wet hydrofluoric acid (HF) solution or may be exposed to a vapor HF etch.

In step 240, the wafer may be loaded back into the deposition tool (step 200) and the subsequent steps performed (steps 210 through 230) until the desired thickness for the polysilicon layer 24 is obtained. For example, if a 12 µm thick polysilicon film 24 is desired, then a film thickness of 4 µm may be formed in step 210 the first time through the process (steps 200 through 230), a film thickness of 5 µm may be formed in step 210 the second time through the process, and a film thickness of 3 µm may be formed in step 210 the third time through the process. Preferably, however, performing 4 µm depositions three times may take advantage of batching of the individual deposition runs. In this manner, any desired thickness may be obtained for the thick polysilicon 24 with the desired residual tensile stress and stress gradient in the film without substantial film cracking. After the desired polysilicon thickness is formed, the wafer may then undergo the subsequent steps discussed previously with regard to FIG. 2.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a thick polysilicon layer for a MEMS inertial sensor, the method comprising:

forming a first mixed phase polysilicon film on a substrate in an elevated temperature environment for a period of time, the mixed phase polysilicon film having a crystalline film at least near the substrate and having an amorphous film at least near a surface of the mixed phase polysilicon film;

forming an oxide layer on the first mixed phase polysilicon film;

annealing the first mixed phase polysilicon film in an environment of about 1100° C. or greater to produce a crystalline polysilicon film throughout the first mixed phase polysilicon film;

removing the oxide layer; and forming a second mixed phase polysilicon film on a surface of the crystalline polysilicon film in an elevated temperature environment for a period of time, the second mixed phase polysilicon film having a second crystalline film at least near the surface of the crystalline polysilicon film and having a second amorphous film at least near a surface of the second mixed phase polysilicon film.

2. The method of claim 1, wherein the first mixed phase polysilicon film, the second mixed phase polysilicon film, or both includes a dopant species having a concentration between about 5e19 atm/cm$^3$ to about 5e20 atm/cm$^3$.

3. The method of claim 2, wherein the dopant species includes phosphorus.

4. The method of claim 1, wherein the elevated temperature environment is between about 550° C. to about 600° C. for the first mixed phase polysilicon film, for the second mixed phase polysilicon film, or for both.

5. The method of claim 1, wherein the oxide layer has a thickness of about 50 Å or greater.

6. The method of claim 5, wherein the oxide layer has a thickness of about 100 Å to about 200 Å.

7. The method of claim 1, wherein removing the oxide layer includes using a hydrofluoric acid etch.

8. The method of claim 1, wherein the first mixed phase polysilicon film is annealed for about 2 hours or greater.

9. The method of claim 1, wherein annealing is in an environment between about 1130° C. to about 1170° C.

10. A method of forming a sense element in a MEMS inertial sensor, the method comprising:

forming a first polysilicon layer on a substrate in an environment between about 550° C. to about 600° C., the first polysilicon layer having a dopant species concentration between about 5e19 atm/cm$^3$ to about 5e20 atm/cm$^3$;

forming an oxide layer on the first polysilicon layer, the oxide layer having a thickness of about 50 Å or greater;

annealing the polysilicon layer in an environment of about 1100° C. or greater;

removing the oxide layer; and forming a second polysilicon layer on the first polysilicon layer in an environment between about 550° C. to about 600° C., the second polysilicon layer having a dopant species concentration between about 5e19 atm/cm$^3$ to about 5e20 atm/cm$^3$.

11. The method of claim 10, wherein the dopant species includes phosphorus.

12. The method of claim 10, wherein removing the oxide layer includes using a hydrofluoric acid etch.

13. The method of claim 10, wherein the oxide layer has a thickness of about 100 Å to about 200 Å.

14. The method of claim 10, wherein the polysilicon layer is annealed for about 2 hours or greater.

15. The method of claim 10, wherein forming the first polysilicon layer, forming the second polysilicon layer, or both is in an environment between about 570° C. to about 590° C.

16. The method of claim 10, wherein annealing is in an environment between about 1130° C. to about 1170° C.

17. The method of claim 10, wherein the annealing environment includes an inert gas.

18. The method of claim 17, wherein the inert gas includes nitrogen.

19. The method of claim 10, wherein forming the oxide layer occurs at the beginning of the annealing process.

20. The method of claim 10, wherein the first polysilicon layer, the second polysilicon layer or both has a thickness of about 4 µm or greater.

* * * * *